United States Patent [19]

Kreidler

[11] 3,851,255

[45] Nov. 26, 1974

[54] PULSE GENERATING CIRCUIT

[75] Inventor: Alfred Kreidler, Zurich, Switzerland

[73] Assignee: Metall-Invent S.A., Baarerstrasse, Switzerland

[22] Filed: May 22, 1973

[21] Appl. No.: 362,704

[52] U.S. Cl. .......... 328/39, 328/110, 328/25, 331/116 R

[51] Int. Cl. .......... H03k 21/00

[58] Field of Search .......... 328/39, 25, 24, 16, 110; 331/37, 38, 41, 42, 116; 307/218, 220

[56] References Cited

UNITED STATES PATENTS

| | | | |
|---|---|---|---|
| 2,566,085 | 8/1951 | Green | 328/25 |
| 3,293,561 | 12/1966 | Hegarty et al. | 331/38 |
| 3,346,742 | 10/1967 | Aniano et al. | 328/110 X |
| 3,462,703 | 8/1969 | Seidel | 331/37 |
| 3,605,026 | 9/1971 | Bowden | 331/38 X |
| 3,760,290 | 9/1973 | Epstein | 331/41 X |

*Primary Examiner*—John S. Heyman
*Attorney, Agent, or Firm*—Elliott I. Pollock

[57] ABSTRACT

A pulse generating circuit, operative to produce a comparatively low frequency train of pulses or a sine wave for driving an electromechanical timing mechanism, comprises at least two quartz crystal oscillators having comparatively high output frequencies which differ from one another. The differing frequency oscillator outputs are supplied as inputs to a gate which, in turn, produces an output pulse whenever coincident pulses are supplied to its input. A comparatively low frequency signal is accordingly produced at the output of the gate without the need of conventional frequency dividers.

6 Claims, 4 Drawing Figures

PULSE GENERATING CIRCUIT

BACKGROUND OF THE INVENTION

The present invention relates to pulse generating circuits, and in particular to pulse generating circuits which receive high frequency input pulses derived from a constant frequency oscillator, and which operate to produce an output pulse sequence of comparatively low frequency for use in the control and drive of an electromechanical converter, e.g., of the type employed in a timing mechanism.

It is conventional in the prior art, in connection with quartz timepieces, to transmit the high frequency oscillations of quartz oscillator circuit to the input side of a divider circuit which then produces a low frequency oscillation as its output, for use in the drive and control of an electromechanical converter. Depending upon the kind of electromechanical converter employed, the output pulses of the divider circuit may be amplified in an amplifier circuit before they are fed to the converter. The electromechanical converters which are commonly used for this purpose comprise synchronous motors, stepping devices, or electromechanical oscillating systems, the latter being synchronized with the output oscillation frequency of the divider circuit.

These known pulse generating circuits have a number of disadvantages, due in part to the fact that the frequencies conventionally produced by quartz oscillators are normally in the KHz or MHz region, whereas the low frequency output of the divider circuit falls into the range of several tens or hundreds of cycles per second. Accordingly, a comparatively large number of divider stages must be employed, and the large number of divider stages in the divider circuit results in a correspondingly large consumption of energy by the circuit. This represents a serious disadvantage since the energy dissipated in the divider circuit may constitute a significant portion of the overall energy consumption in a battery-operated timepiece; and the space requirements of such a divider circuit itself may represent a further disadvantage, particularly in the case of quartz-controlled wrist watches. In addition, the manufacturing costs of this kind of divider circuit are comparatively high, with the cost increasing in proportion to the number of divider stages employed in the pulse generating circuit.

A still further disadvantage resides in the fact that these prior art circuits require quartz elements of a very particular kind, i.e., those which have a minimal frequency change under varying temperature conditions. The latter requirement makes it necessary to very carefully select the quartz elements as to their physical properties.

SUMMARY OF THE INVENTION

It is a primary object of the present invention to provide a pulse generating circuit which obviates the abovementioned shortcomings and disadvantages, and which dispenses with the normally required divider circuit. The present invention achieves this object by providing a pulse generating circuit comprising a high frequency oscillation circuit which includes at least two natural frequency elements whose natural frequencies are different from one another, and whose different-frequency output oscillations are fed to a gate circuit which operates to produce an output pulse whenever the pulses from the natural frequency elements coincide with one another.

The present invention thus makes it possible to derive low frequency output pulses from a high frequency input circuit without the need of a divider circuit having multiple divider stages. It also makes it possible for the natural frequency elements, which are preferably of the quartz type, to be temperature-sensitive at their natural frequency, it being only necessary, in the practice of the present invention, to choose a plurality of different frequency elements which have the same temperature response coefficient.

BRIEF DESCRIPTION OF THE DRAWINGS

Further special features and advantages of the invention will become apparent from the following description, when taken together with the accompanying drawings which illustrate, by way of example, several embodiments of the invention, represented in the various figures as follows.

DESCRIPTION OF THE PREFERRED EMBODIMENTS

Figure 1:
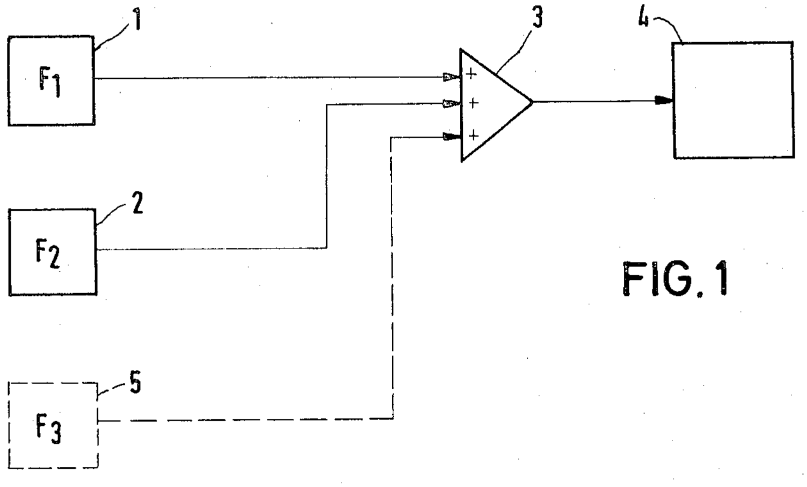
FIG. 1 shows a schematic circuit arrangement of a pulse generating circuit, representing a first embodiment of the invention.

The circuit arrangement shown in FIG. 1 comprises a natural frequency element 1, preferably consisting of a quartz oscillating circuit, which produces an output frequency $F_1$. A second quartz oscillating circuit 2 produces a natural frequency $F_2$ which is different from the frequency $F_1$ of the oscillator 1. The outputs of oscillators 1 and 2, taking the form of oscillation pulses at the frequencies $F_1$ and $F_2$ respectively, are fed to two inputs of a gate circuit 3. The gate circuit 3 opens whenever coincidence exists between a pulse originating from oscillator 1 and a pulse originating from oscillator 2. When such a coincidence occurs, the gate circuit 3 produces an output pulse which is fed to an electromechanical converter 4. This electromechanical converter may be one of several different kinds of converters, e.g., it may be a synchronous motor, an electromechanical stepping device, or a mechanical oscillating system, the latter being synchronized with the output pulses of the pulse generating circuit. The output pulses from gate 3 may be fed directly, or via a shift register, to the converter.

FIG. 1 also depicts, in dotted line, a third quartz oscillating circuit 5 which may be added to cooperate with the quartz oscillating circuits 1 and 2. This third oscillating circuit 5 has a still different natural frequency $F_3$ which is likewise fed to an input of the gate circuit 3. In this case the gate circuit 3 is designed to open only when coincidence exists between a pulse from the pulse sequence $F_1$, a pulse from the pulse sequence $F_2$, and a pulse from the third pulse sequence $F_3$. This arrangement permits a still further frequency division as compared to the division achieved when only two quartz oscillating circuits are employed. As in the case of only two oscillating circuits, the arrangement employing the three oscillating circuits 1, 2, and 5, produces output pulses through the gate circuit 3 which are fed to electromechanical converter 4.

The gate circuit 3 may be operated in a variety of ways. The specific operating mode of the gate circuit 3 depends primarily on the functions which are required of the output pulses from the gate circuit 3 as they are fed to the electromechanical converter 4. For example, if the electromechanical converter is a mechanical oscillating system, it is desirable to feed current pulses to the electromechanical oscillating system which are in the form of short pulses. In order to obtain such a pulse form, the gate circuit 3 should be so arranged that it opens only when coincidence exists between the leading edges, or wave fronts, of the input oscillating pulses fed to the gate circuit 3. Alternatively, the gate circuit may be designed to open in response to coincidence of the trailing edges of the input pulses.

If, the current curve required for the drive of the electromechanical converter 4 is to be sine-shaped, it is possible to obtain such a sine wave by having the gate circuit 3 open, whenever any overlap exists between the input oscillating pulses, for a period of time related to the amount of overlap. The gate circuit 3 will accordingly open for different successive amounts of time which increase in length as the pulses of the two pulse sequence $F_1$ and $F_2$ approach coincidence, and, conversely, the open times of the gate circuit 3 will decrease with increasing separation of the input pulses from said coincidence condition. The output of the gate circuit 3 therefore will constitute a sequence of pulses whose width changes in accordance with the sine function, the maximum pulse width being present when there is full coincidence between the pulses from the pulse sequence $F_1$and the pulses from the pulse sequence $F_2$. The varying-width pulse sequence at the output of the gate circuit 3 can be smoothed into a true sine wave by means of simple smoothing circuit of known type (e.g., an RC-combination); and the maximum amplitude of the resultant sine wave will correspond to the earlier-mentioned full-coincidence condition. Obviously, this specific operating mode of the gate circuit 3 is possible only when two input frequencies are fed to the gate circuit.

Figure 2:
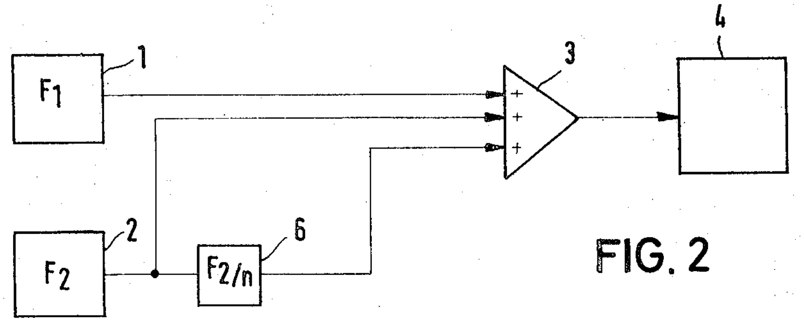
FIG. 2 shows a pulse generating circuit employing a shift register, and representing a second embodiment of the invention.
Figure 3:
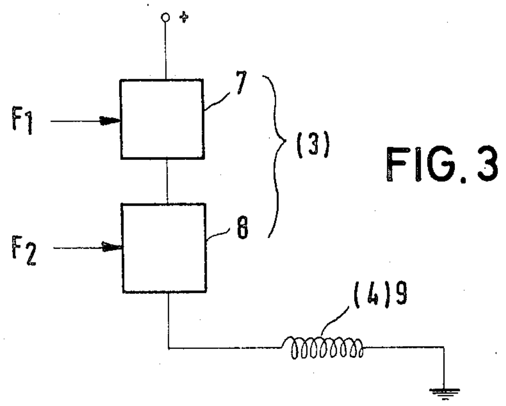
FIG. 3 diagrammatically illustrates a form of gate circuit which may be used in the embodiments of FIGS. 1 and 2.

FIG. 2 illustrates a second embodiment of the invention which again employs a gate circuit 3 having three inputs, the gate circuit opening only when coincidence exists between the three different input pulses which are fed to the gate circuit 3. The first input to the gate circuit 3 is received from a natural frequency element 1 which supplies a pulse sequence $F_1$, and to the second input of the gate circuit 3 is supplied a natural frequency element 2 producing a pulse sequence $F_a$. In this alternative form of the invention, however, the pulses from the frequency element 2 are also fed to the shift terminal of a shift register 6 having a shiftable pulse stored therein and having its output connected to the third input of the gate circuit 3. The shift register 6, by employing a total of *n* stages, makes it possible to select only every *n*th pulse of the pulse sequence $F_2$, and to feed those selected *n*th pulses to the third input of the gate circuit. The choice of *n* in this case will depend on the particular frequencies $F_1$ and $F_2$ of the natural frequency elements 1 and 2. The operating principle of the FIG. 2 circuit is similar to that of the circuit shown in FIG. 1, when three quartz oscillating circuits 1, 2, and 5 are employed. In the embodiment of FIG. 2, however, the third quartz oscillating circuit has been eliminated.

In its simplest version, the gate circuit 3 consists of two series-connected switches 7 and 8 (in the case where only two different input frequencies are used) and the coil or coil system 9 of the electromechanical converter 4 is connected in series with the two switches 7 and 8, the series connected switches being disposed between said converter 4 and a power source. The switch 7 opens whenever it receives a pulse of the frequency sequence $F_1$. Similarly, the switch 8 opens whenever it receives a pulse of the frequency sequence $F_2$. Only when both switches are open at the same time can an electric current flow from the power source to the coil 9. This arrangement is particularly suited for the generation of the earlier described sine-wave drive current for the converter 4.

Figure 4:
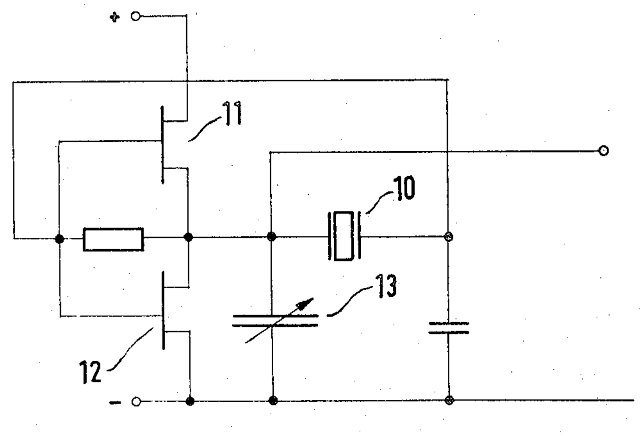
FIG. 4 shows a typical quartz-type oscillating circuit which may be employed in the present invention.

FIG. 4 illustrates an example of a quartz oscillating circuit which uses a quartz element 10 and two field effect transistors 11 and 12. The exact frequency setting is obtained by means of a trimming capacitor 13. The general type of circuit shown in FIG. 4, and its operation, is known in the prior art; and it will be understood that such a circuit could be employed as each of the natural frequency elements 1, 2, and 5 described previously. When quartz elements are used, it is preferable to select the quartz characteristics in such a way that the various quartz elements have the same aging and temperature response characteristics. The lesser the difference between the characteristics of the quartz elements, the smaller will be their influence on the accuracy of the output frequency. Certain constant differences may be compensated for by appropriate circuit means, e.g., by employing shift registers, or by employing trimming capacitors in the oscillating circuits. In addition, it may be desirable to incorporate a pulse shaping circuit in order to obtain a steep wave front on the output pulses.

Having thus described my invention, I claim:

1. A pulse generating circuit comprising first and second individual quartz crystal oscillators operative to produce first and second separate trains of output pulses having first and second different repetition rates respectively, said first and second oscillators having substantially the same temperature response characteristics, means in at least one of said oscillators for adjusting the repetition rate of said oscillator, a gate circuit comprising first and second switches connected in series with one another, means coupling the output of said first oscillator to said first switch to cause said first train of pulses to open said first switch repetitively at said first repetition rate, means coupling the output of said second oscillator to said second switch to cause said second train of pulses to open said second switch repetitively at said second repetition rate, a power source, and an electromechanical converter comprising coil means connected in series with said power source and with said series-connected first and second switches, whereby said coil means is repetitively energized from said power source during successive time intervals when said first and second switches are both opened by pulses from said first and second trains of pulses respectively.

2. The circuit of claim 1 wherein each of said oscillators includes means for individually adjusting the repetition rate of said oscillator.

3. The circuit of claim 1 wherein said gate circuit is operative to open for different successive amounts of time which increase in length as the pulses in said first and second trains of pulses approach coincidence with one another to produce an output pulse train of varying-width pulses.

4. The circuit of claim 3 including means for converting said output train of varying-width pulses into a sine wave energization of said coil means.

5. The circuit of claim 1 wherein said gate circuit is operative to open in response to coincidence of the leading edges of pulses in said first and second trains of pulses.

6. The circuit of claim 1 wherein said gate circuit is operative to open in response to coincidence of the trailing edges of pulses in said first and second trains of pulses.

* * * * *